(12) United States Patent
Tamura et al.

(10) Patent No.: US 7,008,881 B2
(45) Date of Patent: Mar. 7, 2006

(54) METHOD FOR FORMING SILICON EPITAXIAL LAYER

(75) Inventors: Akitake Tamura, Tokyo (JP); Satoshi Oka, Annaka (JP)

(73) Assignee: Tokyo Electron Limited, Tokyo (JP)

( * ) Notice: Subject to any disclaimer, the term of this patent is extended or adjusted under 35 U.S.C. 154(b) by 118 days.

(21) Appl. No.: 10/480,789

(22) PCT Filed: Apr. 9, 2003

(86) PCT No.: PCT/JP03/04501

§ 371 (c)(1),
(2), (4) Date: Dec. 15, 2003

(87) PCT Pub. No.: WO03/088332

PCT Pub. Date: Oct. 23, 2003

(65) Prior Publication Data

US 2004/0175959 A1    Sep. 9, 2004

(30) Foreign Application Priority Data

Apr. 17, 2002  (JP) ............................ 2002-114804

(51) Int. Cl.
*H01L 21/469* (2006.01)

(52) U.S. Cl. ...................... 438/778; 438/780

(58) Field of Classification Search ............... 438/486; 118/715, 725

See application file for complete search history.

(56) References Cited

U.S. PATENT DOCUMENTS

| | | | |
|---|---|---|---|
| 6,008,126 A | 12/1999 | Leedy | |
| 6,395,621 B1 * | 5/2002 | Mizushima et al. | ........ 438/486 |
| 6,630,024 B1 * | 10/2003 | Schmolke et al. | .......... 117/106 |
| 2002/0022351 A1 | 2/2002 | Schmolke et al. | |

FOREIGN PATENT DOCUMENTS

| | | |
|---|---|---|
| DE | 19960823 | 7/2001 |
| EP | 0730048 | 9/1996 |
| JP | 11-040506 | 2/1999 |
| JP | 2002008994 | 1/2002 |

* cited by examiner

*Primary Examiner*—David Nelms
*Assistant Examiner*—Renee R. Berry
(74) *Attorney, Agent, or Firm*—Oblon, Spivak, McClelland, Maier & Neustadt, P.C.

(57) ABSTRACT

A silicon epitaxial layer is formed on the semiconductor underlayer of a target substrate (W) in the process chamber (2). This forming method includes a pressure reducing step of reducing the pressure inside the process chamber (2) accommodating the target substrate (W), a vapor phase growth step of introducing a film formation gas containing silane gas into the process chamber (2) to grow a silicon epitaxial layer on the semiconductor underlayer, and a hydrogen chloride treatment step and a hydrogen heat treatment step performed therebetween. The hydrogen chloride treatment step is arranged to introduce the first pre-treatment gas containing hydrogen chloride gas into the process chamber (2), thereby treating the atmosphere inside the process chamber (2). The hydrogen heat treatment step is arranged to introduce the second pre-treatment gas containing hydrogen gas into the process chamber (2), thereby treating the surface of the semiconductor underlayer.

14 Claims, 7 Drawing Sheets

No hydrogen chloride treatment

Hydrogen chloride treatment at 400°C

Hydrogen chloride treatment at 700°C

Haze level is less than 1ppm in the entire surface

METHOD FOR FORMING SILICON EPITAXIAL LAYER

TECHNICAL FIELD

The present invention relates to a method of manufacturing a silicon epitaxial layer.

BACKGROUND ART

As a technique of manufacturing a silicon epitaxial wafer (to be abbreviated as "epitaxial wafer" in some cases hereinafter), there is a vapor phase growth method which grows a silicon epitaxial layer (to be abbreviated as "epitaxial layer" in some cases hereinafter) on a main surface of a silicon single-crystal substrate (to be abbreviated as "silicon substrate" in some cases hereinafter). An example of the vapor phase growth employs a hot-wall type vertical low pressure CVD apparatus. In this example, the inside of the reaction chamber (process chamber) is set to a relatively low temperature (for example, 600 to 1,000° C.) (as compared to the temperature condition of the mainstream, that is, about 1,100° C.) and a reduced pressure state. While maintaining this state, monosilane gas or dichlorosilane gas is supplied as a silicon material gas into the reaction chamber. In the chamber, a silicon epitaxial layer is grown by vapor phase growth (to be called as "low temperature epitaxial growth" in some cases hereinafter).

With use of the low temperature epitaxial growth method, which involves a low temperature process, the outer diffusion of dopant from the silicon substrate to the epitaxial layer, which is caused by heating, can be suppressed. Therefore, it is possible to obtain an appropriate steep change in resistivity (or change in dopant concentration) at a boundary between the substrate and epitaxial layer. Further, although the growth rate of the epitaxial layer is low (as compared to the case of high temperature), this method can carry out vapor phase growth on a number of (for example, about 25 to 100) silicon substrates mounted on a so-called boat all at once, thereby achieving a very high productivity.

However, the inventors of the present invention found that when a low-temperature epitaxial growth is carried out with use of a hot-wall type vertical low pressure CVD apparatus as described above, the haze level (the degree of surface roughness) of the grown epitaxial layer would be high.

DISCLOSURE OF INVENTION

The present invention has been achieved as a solution to the above-described drawback and an object thereof is to provide a method of forming a silicon epitaxial layer having an excellent surface condition.

According to an aspect of the present invention, there is provided a method of forming a silicon epitaxial layer on a semiconductor underlayer of a target substrate in a process chamber, the method comprising:

a pressure reducing step of reducing a pressure inside the process chamber in which the target substrate has been loaded;

a hydrogen chloride treatment step of introducing a first pre-treatment gas containing hydrogen chloride gas into the process chamber after the pressure reducing step and treating an atmosphere inside the process chamber with the first pre-treatment gas, wherein the atmosphere inside the process chamber is set to a temperature of 500 to 800° C. and a first reduced pressure in the hydrogen chloride treatment step;

a hydrogen heat treatment step of introducing a second pre-treatment gas containing hydrogen gas into the process chamber after the pressure reducing step and treating a surface of the semiconductor underlayer with the second pre-treatment gas, wherein the atmosphere inside the process chamber is set to a temperature higher than 800° C. and a second reduced pressure in the hydrogen heat treatment step; and a vapor phase growth step of introducing a film formation gas containing silane gas into the process chamber after the hydrogen chloride treatment step and the hydrogen heat treatment step, and forming a silicon epitaxial layer on the semiconductor underlayer by vapor phase growth, wherein the atmosphere inside the process chamber is set to a film forming temperature and a reduced pressure in the vapor phase growth step.

In the hydrogen chloride treatment step, the concentration of hydrogen chloride in the atmosphere inside the process chamber may be set to 0.5 to 20% by volume. The first reduced pressure may be set to 0.1 to 10 Torr.

Further, according to a preferred manner, the silicon epitaxial layer forming method may be arranged such that the process chamber has a structure in which a plurality of target substrates are accommodated while being stacked in a vertical direction with an interval between adjacent ones, that the atmosphere inside the process chamber is heated with a heater disposed around the process chamber, and that the target substrates are treated all together in the hydrogen chloride treatment step, the hydrogen heat treatment step, and the vapor phase growth step.

BEST MODE FOR CARRYING OUT THE INVENTION

Figure 1:
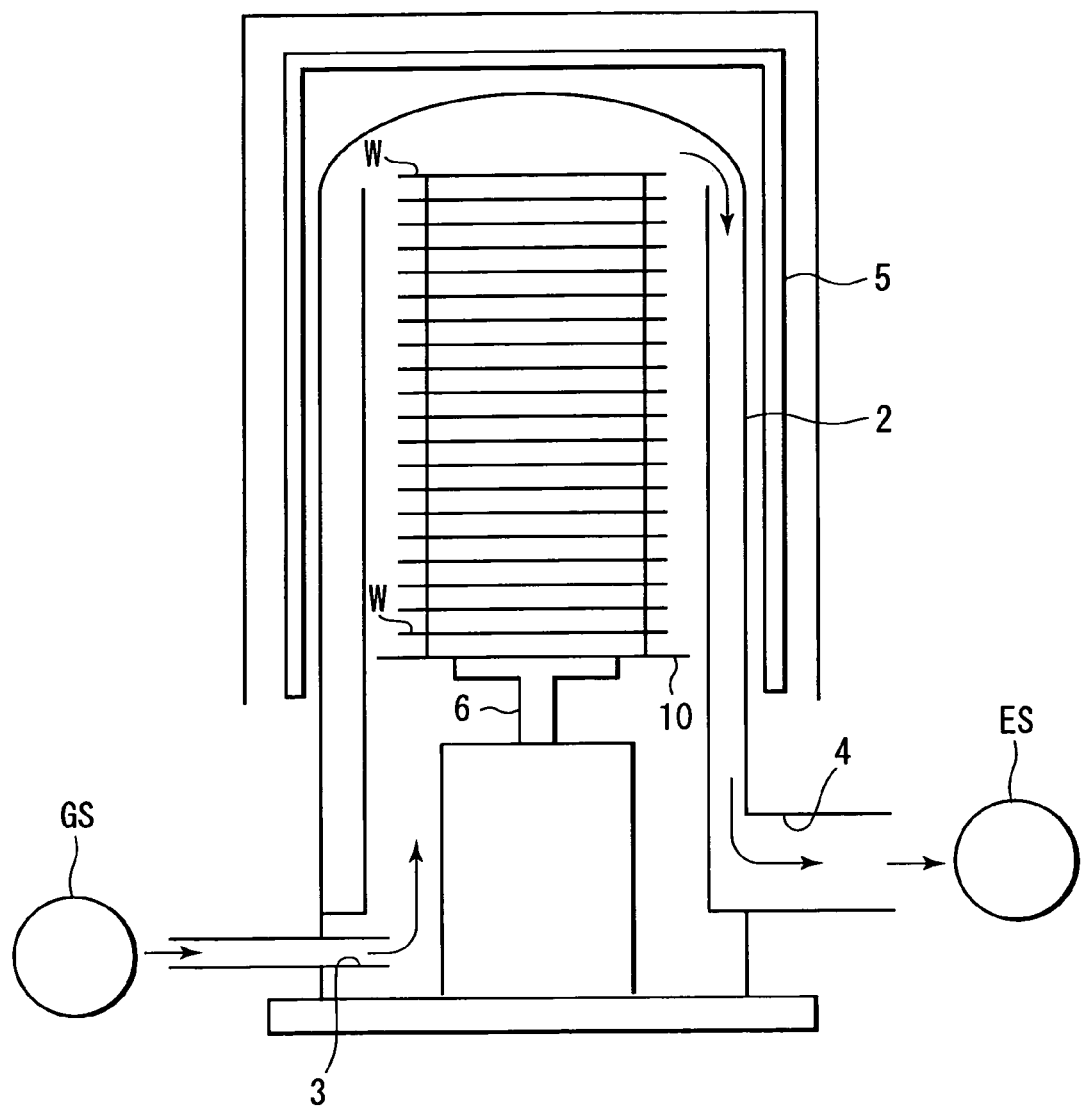
FIG. 1 is a sectional front view schematically showing a hot-wall type vertical low pressure CVD apparatus, which is a vapor phase growth apparatus according to an embodiment of the present invention.

In the process of developing the present invention, the inventors carried out researches on the reason why the haze level (the degree of surface roughness) of an epitaxial layer becomes high when it is grown by a low temperature epitaxial growth method using a hot-wall type vertical low pressure CVD apparatus. In the researches, they found the fact that will now be described.

In the vapor phase growth, the atmosphere inside the reaction chamber is exhausted using a pump of, for example, an oil diffusion type, in order to form a reduced pressure atmosphere in the reaction chamber (process chamber). Therefore, in the gas exhaust tube equipped with the pump, a number of carbon compounds (originated from the oil of the pump) are floating around. Here, under a reduced pressure atmosphere, there are a less number of obstacles (the number of molecules) as compared to the case of the normal atmosphere, and therefore the mobility of each molecule increases, making it easy for carbon compounds in the exhaust tube to flow back into the reaction chamber (which is called oil back.) Due to the oil back and the like, carbon compounds are present within the reaction chamber. Further, in some cases, while loading a wafer into the reaction chamber, organic matters attached to the water outside the reaction chamber, that is, for example, organic matters in the air or those remaining after insufficient cleaning of the wafer, are brought into the chamber. When such carbon compounds are present in the reaction chamber during vapor phase growth, haze can be easily generated on the surface of an epitaxial layer to be produced.

When hydrogen chloride gas is supplied into the reaction chamber, hydrogen chloride serves to weaken the bonding power in the carbon compounds, which cause the generation of the haze, and easily decompose the compounds to be gasified. In other words, a hydrogen chloride treatment is carried out inside the reaction chamber, and thus the carbon compounds in the reaction chamber are gasified so that they can be easily removed (exhausted) from the reaction chamber. Thus, when a hydrogen chloride treatment is carried out, the inside of the reaction chamber can be adjusted to a clean environment suitable for vapor phase growth.

When a target substrate is just loaded in the reaction chamber, there is an oxide film naturally formed on a semiconductor underlayer of the substrate, that is, for example, the surface of the silicon single-crystal substrate. When hydrogen gas is supplied into the reaction chamber and the inside of the chamber is heated, hydrogen serves to remove the natural oxide film, and the surface of the semiconductor underlayer is made bare to be suitable for vapor phase growth.

To put it simply, first, a hydrogen chloride treatment is performed to regulate the environment inside the reaction chamber. Furthermore, a hydrogen heat treatment is performed to treat the surface of the semiconductor underlayer to be in such a state appropriate for the vapor phase growth. Next, with use of thus prepared environment, the vapor phase growth is carried out at an appropriate temperature condition. In this manner, it is possible to form a silicon epitaxial layer having less surface roughness and an excellent surface state even if it is formed at a low temperature.

Embodiments of the present invention that has been achieved on the basis of the above-described findings will now be described with reference to accompanying drawings.

FIG. 1 is a sectional front view schematically showing a hot-wall type vertical low pressure CVD apparatus, which is a vapor phase growth apparatus according to an embodiment of the present invention. As shown in FIG. 1, the vertical low pressure CVD apparatus 1 has a reaction chamber (process chamber) 2 made of, for example, quartz. A supplying section GS is connected to the reaction container 2 via a supply tube 3 to supply a treatment gas to the chamber. An exhaust section ES (including a vacuum pump and the like) is connected to the reaction container 2 via an exhaust tube 4 to exhaust the reaction container 2 and set it to a reduced pressure state. A heater 5 is provided around the chamber 2 to heat the atmosphere inside the reaction chamber 2.

Semiconductor substrates W (of silicon single crystal type in this embodiment) are held in a wafer boat (holder) 10 while keeping each of them horizontally and stacked one on another with an interval between them when they are treated within the reaction container 2. The boat 10 has such a structure that can hold a number of (for example, about 25 to 100) substrates W. The boat 10 is rotated around its vertical axis by means of a driving mechanism 6 during the treatment.

FIG. 1 shows a state where the boat 10, in which a number of silicon substrates W are held (mounted), is placed within the reaction chamber 2. However, FIG. 1 illustrates a less number of silicon substrates W than the actual number for simplification, and the uppermost and lowermost ones of the silicon substrates W are denoted by their reference symbol.

Figure 2:
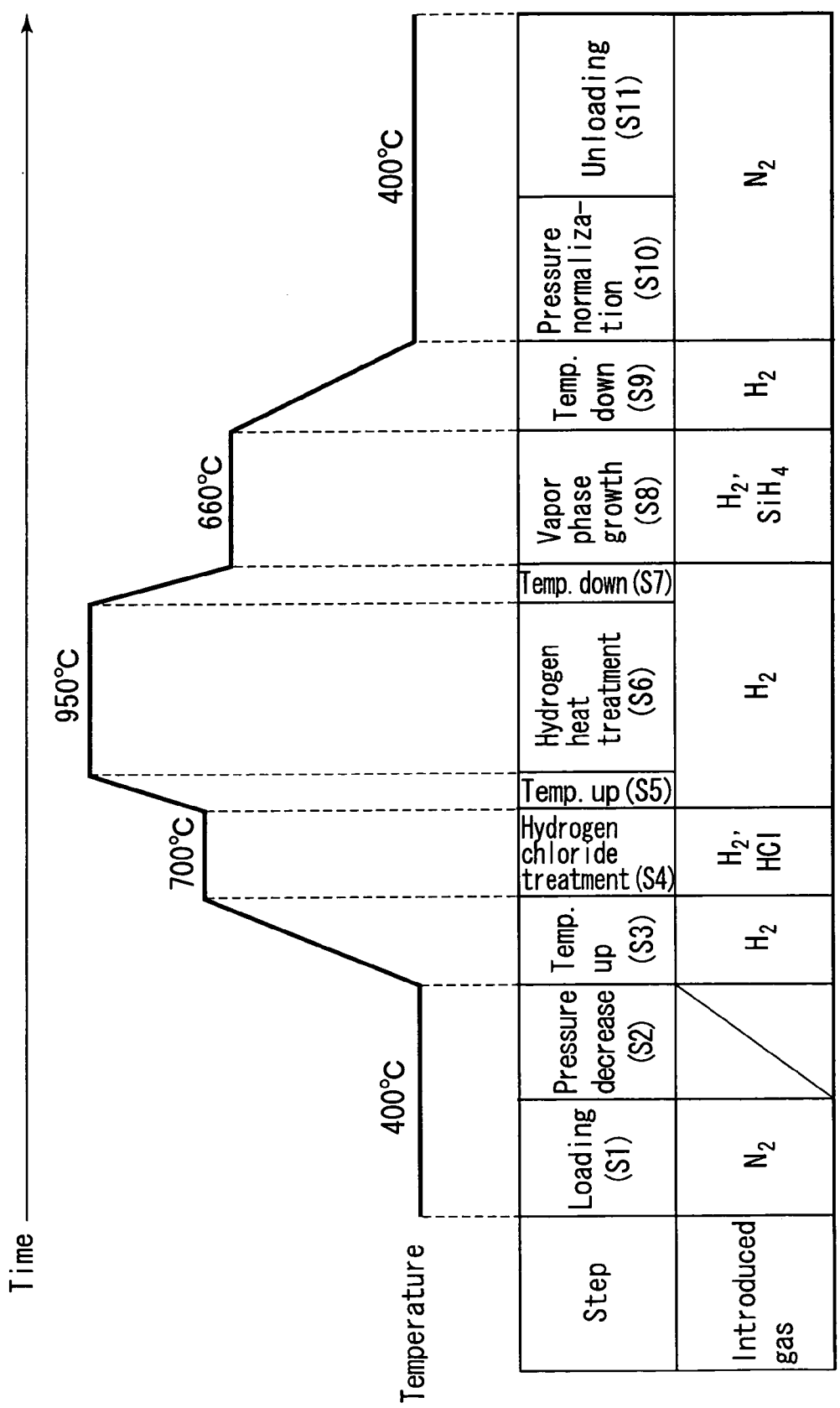
FIG. 2 is an explanatory diagram showing the steps of a method of manufacturing a silicon epitaxial wafer according to a first embodiment of the present invention.

Next, an explanation will be given of a method of forming a silicon epitaxial layer, which is carried out with use of the vertical low pressure CDV apparatus 1 having the above-described structure, according to an embodiment of the present invention. Here, as an example of the method of forming a silicon epitaxial layer, a method of manufacturing a silicon epitaxial wafer by forming a silicon epitaxial layer on the main surface of a silicon single crystal substrate (semiconductor underlayer) by vapor phase growth will now be described. FIG. 2 is an explanatory diagram showing the steps of a method of manufacturing a silicon epitaxial wafer according to a first embodiment of the present invention. FIG. 2 illustrates steps carried out along a lapse of time, and the temperature inside the reaction chamber and the gas introduced to the reaction chamber in each step, in relation to each other.

<Method of Manufacturing Silicon Epitaxial Wafer>

First, silicon substrates W are loaded into the reaction chamber 2. That is, the boat 10 in which a number of silicon wafers W are held in advance is loaded into the reaction container 2. (Step S1 (loading step)) At this stage, $N_2$ gas is introduced to the reaction chamber 2 via the supply tube 3 as a purge gas.

Next, the introduction of the $N_2$ gas to the reaction chamber 2 is stopped, and the vacuum pump is driven. In this manner, the pressure inside the reaction chamber 2 is reduced to, for example, about 1 mm Torr (about 0.13 Pa) (Step S2 (pressure decrease step)).

Subsequently, while introducing $H_2$ into the reaction chamber 2, the inside of the reaction chamber 2 is heated by the heater 5. In this manner, the temperature of the atmosphere inside the reaction chamber 2 is increased (Step S3 (temperature increase step)) to a temperature condition that is used in the next step, hydrogen chloride treatment.

Then, while maintaining the temperature inside the reaction chamber at the level obtained by the step S3 of temperature increase, the hydrogen chloride treatment (Step S4) is carried out. During this step, a first pre-treatment gas containing hydrogen chloride gas (HCl) is introduced to the reaction chamber 2 for a predetermined time (for example, 5 minutes or more and less than 30 minutes, and more specifically, about 10 minutes). While this step, the supply of the $H_2$ gas is maintained as it is. Thus, the $H_2$ gas will serve as a carrier gas and diluent gas for the HCl gas, and therefore HCl will be supplied at a uniform concentration entirely from the bottom portion within the reaction chamber 2 to its top portion.

Inside the reaction chamber 2, carbon compounds are present due to the oil back, and the like. When hydrogen chloride gas is introduced to the reaction chamber 2 as described above, those carbon compounds can be easily decomposed as the coupling force is weakened. Thus decomposed carbon compounds are gasified, and therefore they can be easily removed from the reaction chamber.

That is, by introducing the first pre-treatment gas containing the hydrogen chloride gas to the reaction chamber 2, the carbon compounds within the reaction chamber 2 can be decomposed and therefore they can be easily removed (exhausted). In this manner, the inside of the reaction chamber 2 can be cleaned and adjusted to such an environment that is appropriate for vapor phase growth.

It should be noted that in the hydrogen chloride treatment, the temperature of the atmosphere inside the reaction chamber 2 is set to 500 to 800° C., preferably, 700 to 800° C., for example, about 700° C. If the treatment temperature is less than 500° C., hydrogen chloride cannot serve to decompose and remove carbon compounds sufficiently within a short period of time. On the other hand, if the treatment temperature exceeds 800° C., the surface of the silicon substrate W is corroded, thereby creating haze in some cases.

In the hydrogen chloride treatment, the concentration of hydrogen chloride in the atmosphere inside the reaction chamber 2 is set to 0.5 to 20% by volume, preferably, 1 to 5% by volume. Further, in the hydrogen chloride treatment, the reduced pressure inside the reaction chamber 2 is set to 0.1 to 10 Torr, preferably, 0.1 to 2 Torr.

Next, the introduction of the first pre-treatment gas is finished, and at the same time, the output to the heater 5 is increased. Thus, the temperature of the atmosphere inside the reaction chamber 2 is increased (Step S5 (temperature increase step)) to a temperature condition that is used in the next step, hydrogen heat treatment.

Then, while maintaining the temperature inside the reaction chamber 2 at the level obtained by the step S5 of temperature increase, the hydrogen heat treatment (Step S6) is carried out. During this step, a second pre-treatment gas containing hydrogen gas ($H_2$) is introduced to the reaction chamber 2 for a predetermined time (for example, 15 to 120 minutes, and more specifically, about 30 minutes). It should be noted that the supply of the $H_2$ gas is continuously carried out from the step S3 (temperature increase step) to the step S6.

As the hydrogen heat treatment is carried out, the silicon substrate W is subjected to the hydrogen heat treatment (hydrogen etching) within a hydrogen atmosphere. Thus, the natural oxide film on the surface of the silicon substrate W is removed, thus exposing the surface (to make a bare state).

It should be noted that in the hydrogen heat treatment, the temperature of the atmosphere inside the reaction chamber 2 is set to 800 to 1,100° C., preferably, 950 to 1,050° C., for example, about 1,050° C. If the treatment temperature is less than 800° C., hydrogen cannot serve to etch the natural oxide film sufficiently within a short period of time. On the other hand, if the treatment temperature exceeds 1,100° C., the slip dislocation defect is likely to occur, and actually, the slip dislocation defect occurs frequently.

Further, in the hydrogen heat treatment, the concentration of hydrogen in the atmosphere inside the reaction chamber 2 is about 100% by volume, and impurities such as $SiH_4$, HCl and HF are controlled to be less than 0.1% by volume. Furthermore, in the hydrogen heat treatment, the reduced pressure inside the reaction chamber 2 is set to 0.1 to 20 Torr, preferably, 2 to 8 Torr.

Next, the introduction of the second pre-treatment gas is finished, and at the same time, the output to the heater 5 is decreased. Thus, the temperature of the atmosphere inside the reaction chamber 2 is decreased to a temperature condition that is used in the next step, vapor phase growth (Step S7 (temperature decrease step)).

Then, while maintaining the temperature inside the reaction chamber 2 at the level obtained by the step S7 of temperature decrease, the vapor phase growth (Step S8) is carried out. During this step, a film formation gas containing monosilane gas ($SiH_4$) is introduced to the reaction chamber 2 for a predetermined time (for example, 20 to 60 minutes, and more specifically, for example, about 40 minutes). Here, the supply of the $H_2$ gas is maintained as it is. It should be noted that the supply of the $H_2$ gas is continuously carried out from the step S3 (temperature increase step) to the step S8. With the supply of the film formation gas, a silicon epitaxial layer is formed by vapor phase growth on the main surface of the silicon substrate W, and thus a silicon epitaxial wafer is manufactured.

At this stage, the carbon compounds have been already removed from the reaction chamber 2 by the hydrogen chloride treatment carried out before. In addition, with the hydrogen heat treatment carried out, the main surface of the silicon substrate W is made bare. Further, the temperature condition for carrying out the vapor phase growth is appropriate to suppress surface roughness as will be described later. Therefore, in the vapor phase growth, an epitaxial layer having less surface roughness and an excellent surface state can be formed.

It should be noted that in the vapor phase growth, the temperature of the atmosphere inside the reaction chamber 2 is set to 550 to 750° C., preferably, 550 to 700° C., for example, about 660° C. Further, the reduced pressure inside the reaction chamber 2 is set to 0.1 to 10 Torr, preferably, 0.1 to 0.2 Torr.

In the case where monosilane gas is used, if the treatment temperature is less than 550° C., it is difficult to form an silicon epitaxial layer by a CVD method. On the other hand, if the treatment temperature exceeds 750° C., the thermal decomposition of the monosilane within the gas phase becomes vigorous, thereby generating a number of particles.

Next, the introduction of the monosilane gas into the reaction chamber 2 is finished, and at the same time, the output to the heater 5 is decreased. Thus, the temperature of the atmosphere inside the reaction chamber 2 is decreased to a temperature condition that is appropriate for unloading the silicon epitaxial wafer (for example, about 400° C.) (Step S9 (temperature decrease step)).

Then, the gas to be introduced to the reaction chamber 2 is switched from $H_2$ gas to $N_2$ gas. Further, the inside of the reaction chamber 2 is regulated to have normal pressure (Step S10 (pressure normalization step)), and then epitaxial wafers are unloaded from the reaction chamber 2 at once together with the boat 10 (Step S11 (unloading step)).

In the above-described embodiment, the inside of the reaction chamber 2 is cleaned by the hydrogen chloride treatment and thus the environment inside the chamber 2 is appropriately adjusted. Further, with the hydrogen heat treatment carried out, the surface of the silicon substrate W can be made such a bare state that is suitable for the vapor phase growth. Then, the vapor phase growth is carried out under an appropriate temperature condition. Thus, a silicon epitaxial wafer with less surface roughness and an excellent surface state can be manufactured.

Figure 3C:
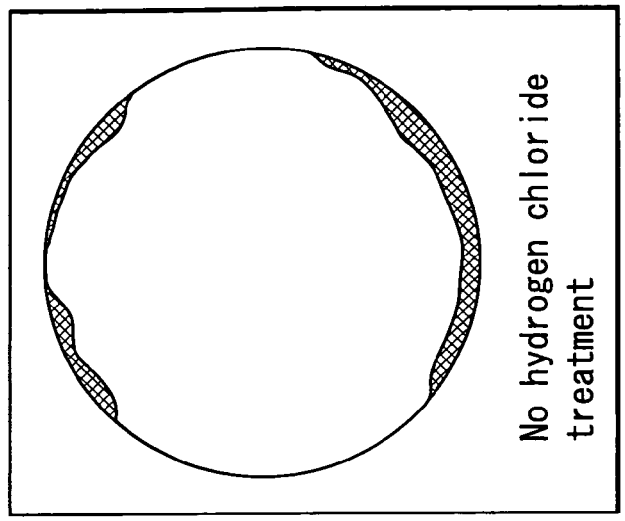
FIGS. 3A, 3B and 3C are diagrams each showing the haze level of the surface of the silicon epitaxial layer, obtained under different hydrogen chloride treatment conditions.
Figure 3B:
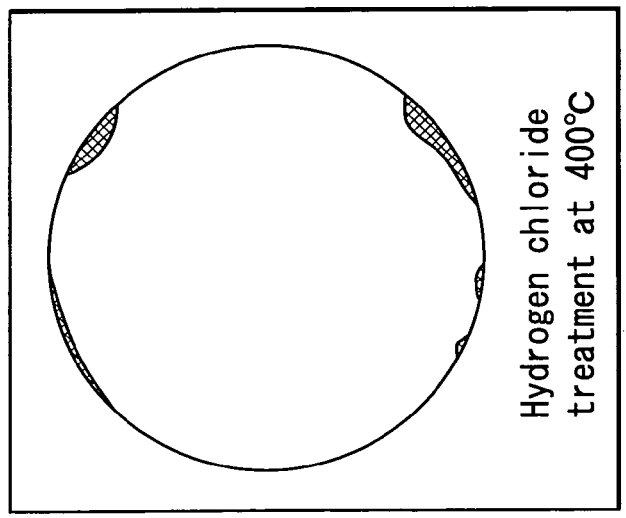
Figure 3A:
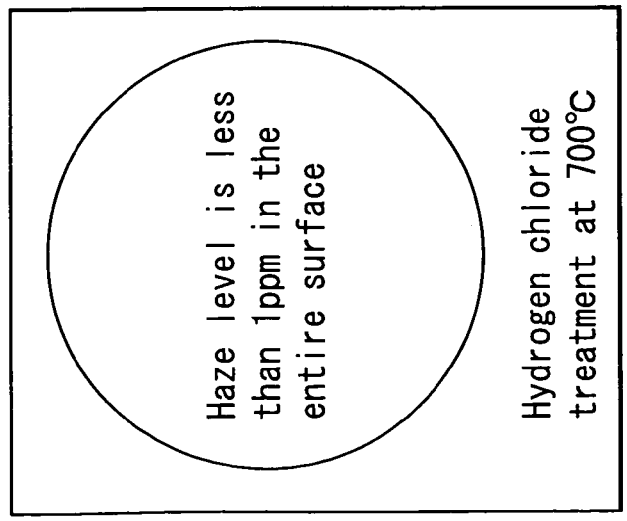

FIGS. 3A, 3B and 3C are diagrams each illustrating the haze level of the surface of each of silicon epitaxial layers obtained under different conditions for the hydrogen chloride treatment. FIG. 3A indicates a case where the epitaxial layer was formed by a method according to the first embodiment described above, and in this method, the hydrogen chloride treatment was carried out at a temperature of 700° C. FIG. 3B indicates a case where the epitaxial layer was formed by a method according to the first embodiment described above, except that the hydrogen chloride treatment was carried out at a temperature of 400° C. FIG. 3C indicates a case where the epitaxial layer was formed by a method according to the first embodiment described above, except that the hydrogen chloride treatment was not carried out.

In FIGS. 3A, 3B and 3C, only the sections in the surface of the epitaxial layer, where the haze level is 1 ppm or higher, is indicated by shaded areas. The degree of scattering light by the haze is expressed in ratio with respect to the intensity of incident light. In the case where the scattering light has one millionth of the intensity of the incident light, the degree of the scattering light is indicated as 1 ppm.

As shown in FIG. 3C, the epitaxial layer formed without performing the hydrogen chloride treatment had a poor haze level in peripheral portions of the surface.

As shown in FIG. 3B, the epitaxial layer formed with the hydrogen chloride treatment carried out at 400° C. had some improvement as compared to the case where no hydrogen chloride treatment was carried out. However, in this case as well, its haze level is bad in peripheral portions of the surface. In other words, in the case where the hydrogen chloride treatment is carried out at 400° C., the inside of the reaction chamber 2 cannot be sufficiently cleaned.

By contrast, the epitaxial layer shown in FIG. 3A, formed with the hydrogen chloride treatment carried out at 700° C., showed no section in its surface, where the haze level was 1 ppm or higher. In other words, the inside of the reaction chamber 2 can be sufficiently cleaned by carrying out the hydrogen chloride treatment at 700° C.

Figure 4:
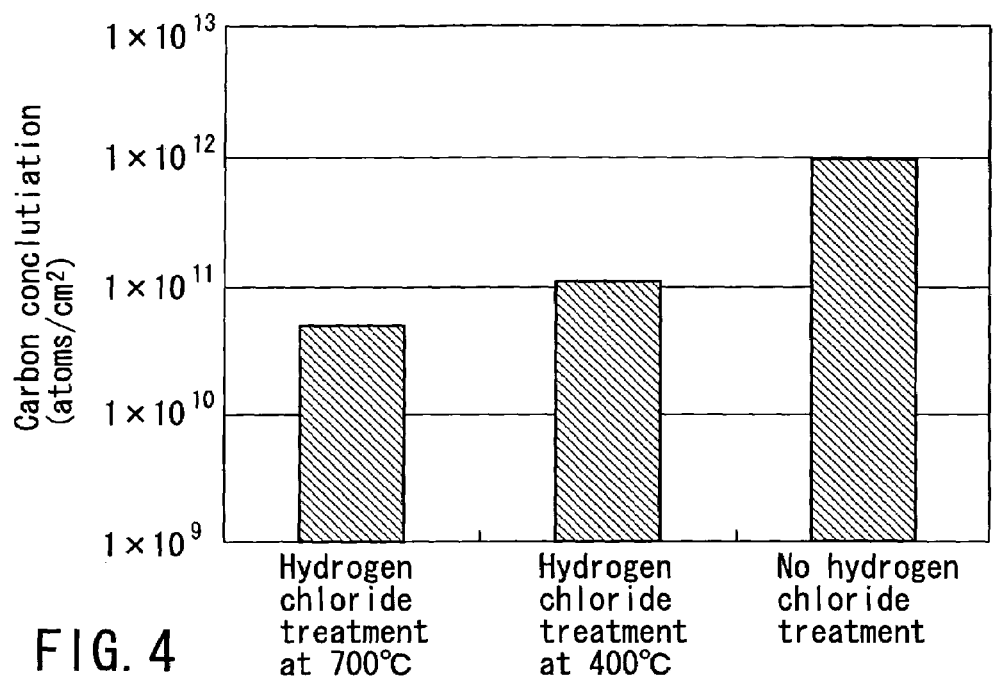
FIG. 4 is a graph indicating the carbon concentration at a peripheral portion of the surface of each of the silicon epitaxial layers formed by the three methods corresponding to those shown in FIGS. 3A, 3B and 3C.

FIG. 4 is a graph indicating the carbon concentration in the peripheral portion on the surface of each of the silicon epitaxial layer formed by these three methods. As shown in FIG. 4, the epitaxial layer formed with the hydrogen chloride treatment carried out at 700° C. exhibited the lowest carbon concentration in the peripheral portion of the surface of the epitaxial layer.

Figure 5A:
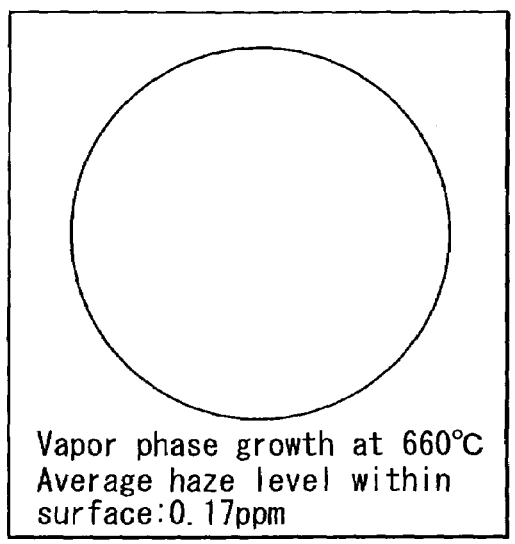
FIGS. 5A and 5B are diagrams each showing the haze level of the surface of the silicon epitaxial layer, obtained under different vapor phase growth conditions.
Figure 5B:
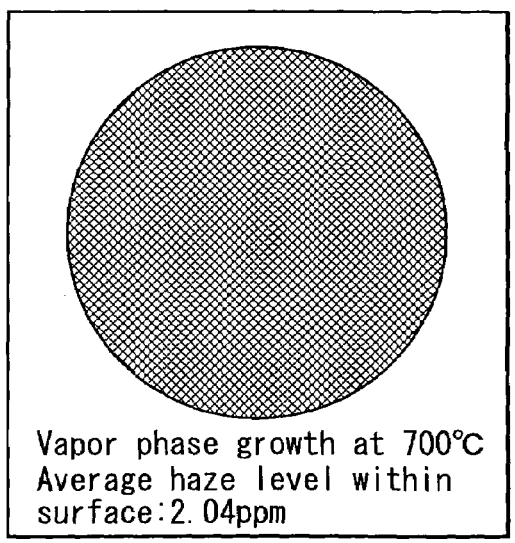

FIGS. 5A and 5B are diagrams indicating the haze level of the surface of each of silicon epitaxial layers, which were formed by vapor phase growth carried out under different conditions. FIG. 5A shows a case where the epitaxial layer was formed by a method according to the first embodiment described above, and in which method, the vapor phase growth was carried out with use of a monosilane gas at a temperature of 660° C. FIG. 5B shows a case where the epitaxial layer was formed by a method according to the first embodiment described above, and in which method, the vapor phase growth was carried out with use of a monosilane gas at a temperature of 700° C.

As shown in FIG. 5B, when the vapor phase growth was carried out at 700° C., haze of a level of 2 ppm is distributed lightly on the entire surface of the epitaxial layer. On the other hand, as shown in FIG. 5A, when the vapor phase growth was carried out at 660° C., the haze level of the surface of the epitaxial layer is about 0.2 ppm. That is, in the case where monosilane gas is used as a silicon material gas, it is preferable that the vapor phase growth should be carried out at a temperature less than 700° C. in order to suppress the surface roughness of the epitaxial layer. In this manner, a silicon epitaxial wafer with less surface roughness and an excellent surface state can be manufactured.

It should be noted that the vapor phase growth may be carried out at a temperature of 700 to 750° C. with use of a monosilane gas. This is because haze of such a level obtained in an epitaxial wafer manufactured, for example, under the above temperature condition can be improved by means of polishing.

<Second Embodiment>

Figure 6:
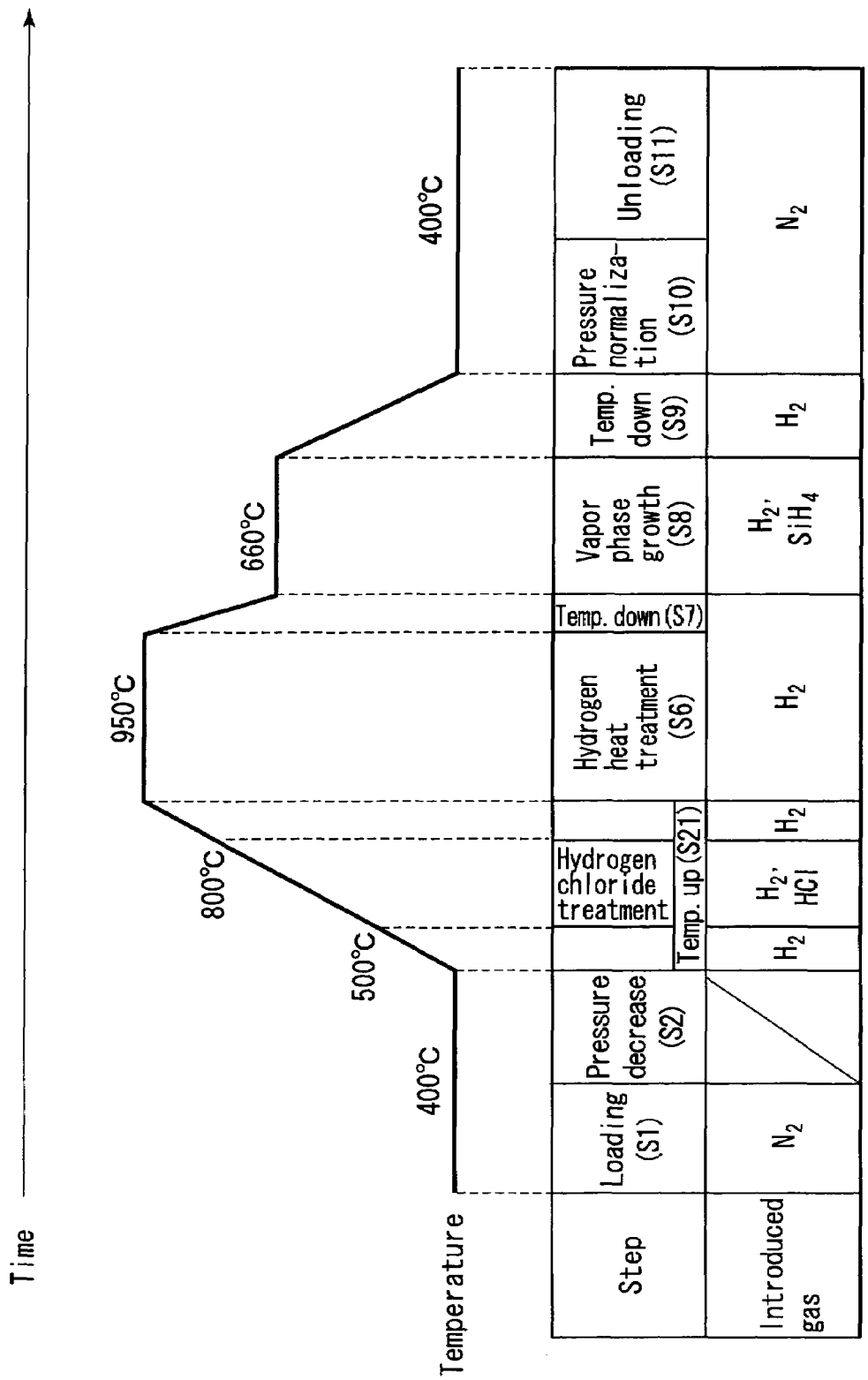
FIG. 6 is an explanatory diagram showing the steps of a method of manufacturing a silicon epitaxial wafer according to a second embodiment of the present invention.

In the above-described embodiment, during the hydrogen chloride treatment being carried out, the temperature inside the reaction chamber 2 is maintained at constant. However, the hydrogen chloride treatment may be started, for example, while increasing the temperature after loading the silicon substrate W into the reaction chamber 2. FIG. 6 is a diagram illustrating the steps of a silicon epitaxial wafer manufacturing method according to a second embodiment of the present invention, proposed based on the above-described point. FIG. 6 indicates the steps carried out along with time elapse, and the temperature inside the reaction chamber and the gas introduced to the reaction chamber in each step, in relation to each other.

In the second embodiment, as shown in FIG. 6, for example, step S21, which will now be described, is carried out in place of the steps S3, S4 and S5 shown in FIG. 2. That is, the step S21 is a temperature increase step that is carried out immediately after the silicon substrate W is loaded in the chamber and the pressure inside the reaction chamber 2 is reduced. In the step S21, the inside of the reaction chamber 2 is heated by the heater 5 in order to meet a temperature condition for carrying out the next step, the hydrogen heat treatment. The aimed temperature of the heating here is 800 to 1,100° C., preferably, 950 to 1,050° C., for example, about 1,050° C.

In the method according to the second embodiment, the hydrogen chloride treatment is carried out in the course of temperature increase. More specifically, while the temperature inside the reaction chamber 2 is increasing in a range of 500 to 800° C., the first pre-treatment gas containing hydrogen chloride gas is introduced to the reaction chamber 2 for a predetermined time (for example, 5 minutes or more but less than 30 minutes, more specifically, about 10 minutes, for example). Thus, the temperature condition in the course of temperature increase is utilized to carry out the hydrogen chloride treatment.

It should be noted that in the second embodiment, the steps involved here are the same as those of the first embodiment (FIG. 2) except that the step S21 is carried out in place of the steps S3, S4 and S5. Therefore, the explanations of the other steps will be omitted here.

According to the second embodiment, the time efficiency in manufacturing a silicon epitaxial wafer can be further improved.

<Third Embodiment>

Figure 7:
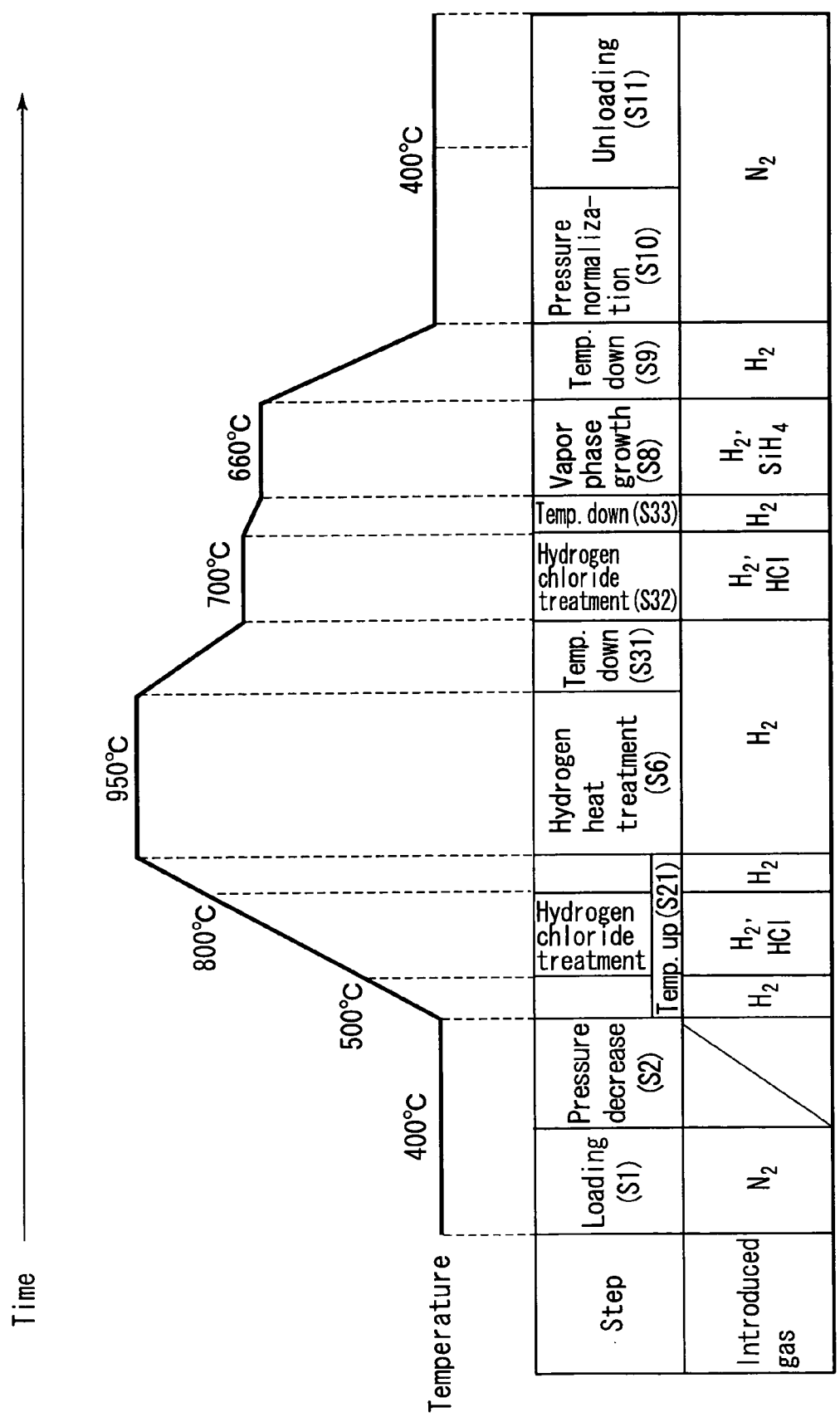
FIG. 7 is an explanatory diagram showing the steps of a method of manufacturing a silicon epitaxial wafer according to a third embodiment of the present invention.

In the first and second embodiments, the hydrogen heat treatment is carried out after the hydrogen chloride treatment is carried out. Here, it is alternatively possible that another hydrogen chloride treatment (the second hydrogen chloride treatment) is carried out after the hydrogen heat treatment. FIG. 7 is a diagram illustrating the steps of a silicon epitaxial wafer manufacturing method according to a third embodiment of the present invention, proposed based on the above-described point. FIG. 7 indicates the steps carried out along with time elapse, and the temperature inside the reaction chamber and the gas introduced to the reaction chamber in each step, in relation to each other.

In the third embodiment, as shown in FIG. 7, for example, the output to the heater 5 is decreased after the hydrogen heat treatment is carried out (Step S6). Thus, the temperature inside the reaction chamber 2 is decreased to a condition for carrying out a hydrogen chloride treatment (500 to 800° C., preferably 700 to 800° C., for example, about 700° C.) (Step S31).

While maintaining the above temperature condition, the second hydrogen chloride treatment (Step S32) is carried out. During this treatment, the process gas containing hydrogen chloride gas is introduced to the reaction chamber 2 for a predetermined time (for example, 5 minutes or more but less than 30 minutes, more specifically, about 10 minutes, for example).

After that, the temperature inside the reaction chamber 2 is decreased to a condition for carrying out the next step, vapor phase growth (that is, 550 to 750° C., preferably 550 to 700° C., for example, about 660° C.) (Step S33 (temperature decrease step)). Then, while maintaining the temperature inside the reaction chamber 2 at the level obtained by the step S33 of temperature decrease, the vapor phase growth (Step S8) is carried out with use of the film formation gas containing monosilane gas ($SiH_4$).

It should be noted that in the third embodiment, the steps involved here are the same as those of the second embodiment (FIG. 6) except that the steps S31, S32 and S33 are carried out in place of the step S7. Therefore, the explanations of the other steps will be omitted here.

According to the third embodiment, the second hydrogen chloride treatment is carried out immediately before the vapor phase growth, and therefore the inside of the reaction chamber 2 can be more efficiently cleaned.

<Fourth Embodiment>

Figure 8:
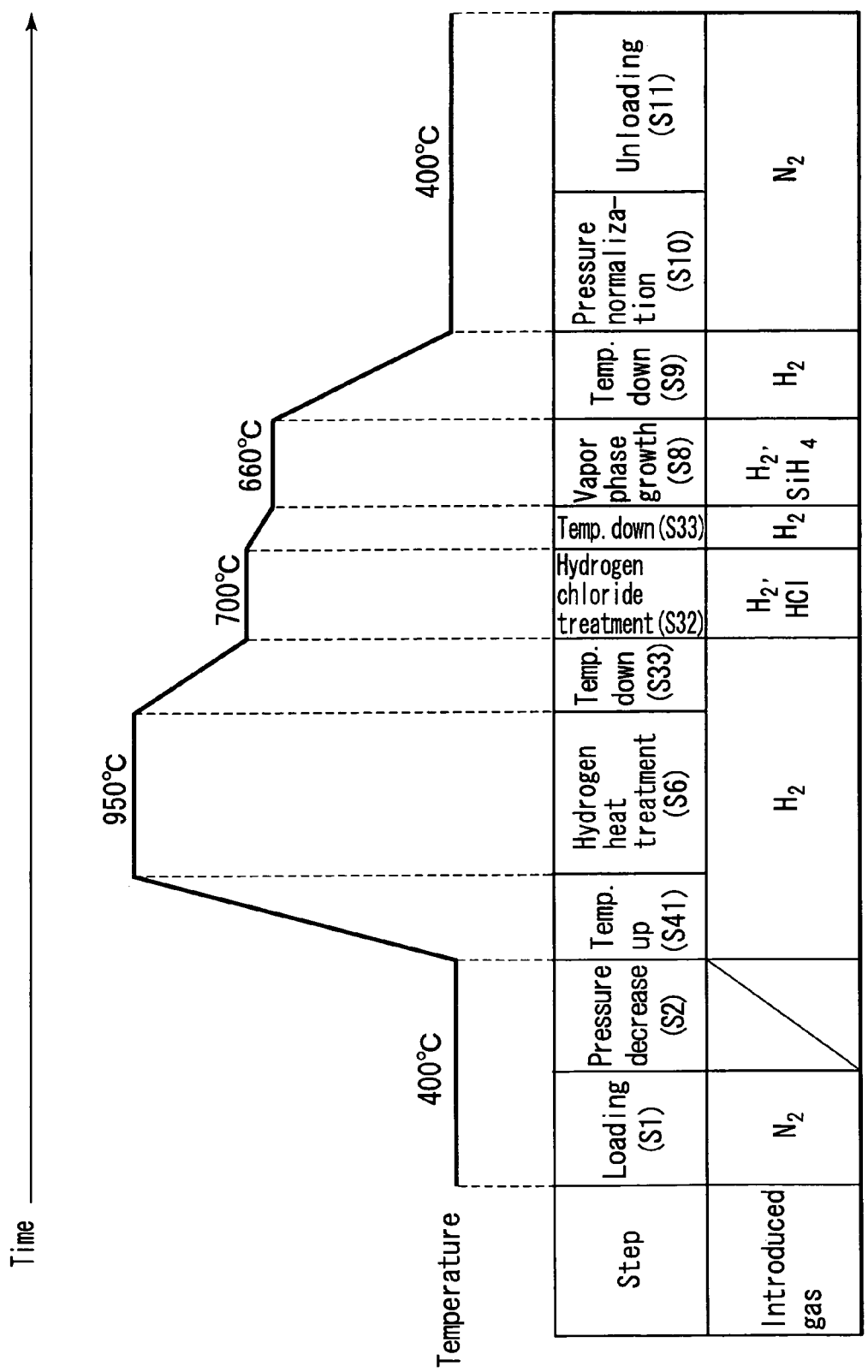
FIG. 8 is an explanatory diagram showing the steps of a method of manufacturing a silicon epitaxial wafer according to a fourth embodiment of the present invention.

In the first to third embodiments, the hydrogen heat treatment is carried out after the hydrogen chloride treatment is carried out. Here, it is alternatively possible that the hydrogen chloride treatment is carried out only after the hydrogen heat treatment. FIG. 8 is a diagram illustrating the steps of a silicon epitaxial wafer manufacturing method according to a fourth embodiment of the present invention, proposed based on the above-described point. FIG. 8 indicates the steps carried out along with time elapse, and the temperature inside the reaction chamber and the gas introduced to the reaction chamber in each step, in relation to each other.

In the fourth embodiment, as shown in FIG. 8, for example, step S41, which will now be described, is carried out in place of the step S21 in FIG. 7. That is, the step S41 is a temperature increase step carried out immediately after the silicon substrate W is loaded in the reaction chamber and the pressure inside is reduced. In the step 41, while H2 is introduced into the reaction chamber 2, the inside thereof is heated with the heater 5, and thus the temperature inside the reaction chamber 2 is increased to a condition for carrying out the next step, hydrogen heat treatment. The aimed temperature of the heating here is 800 to 1,100° C., preferably, 950 to 1,050° C., for example, about 1,050° C.

It should be noted that in the fourth embodiment, the steps involved here are the same as those of the third embodiment (FIG. 7) except that the step S41 is carried out in place of the step S21. Therefore, the explanations of the other steps will be omitted here.

In the third and fourth embodiments, the temperature inside the reaction chamber 2 is maintained at constant (for example, at about 700° C.) when carrying out the hydrogen chloride treatment after the hydrogen heat treatment. Here, it is alternatively possible that the hydrogen chloride treatment is carried out in the course of temperature decrease inside the reaction chamber 2 from that for the hydrogen heat treatment (for example, about 950° C.) to that for the vapor phase growth (for example, about 660° C.). In this manner, the time efficiency in manufacturing a silicon epitaxial wafer can be further improved.

In the first to fourth embodiments, the treatment is carried out with use of a vertical low pressure CVD apparatus 1. However, the present invention can be applied also to a case where a silicon epitaxial layer is formed with use of another apparatus, for example, a single-wafer type low pressure CVD apparatus. Further, the first to fourth embodiments were described in connection with a method of forming a silicon epitaxial wafer as an example of a method of forming a silicon epitaxial layer. However, the present invention can be applied also to a case where a silicon epitaxial layer is formed in the process of manufacturing a semiconductor device.

What is claimed is:

1. A method of forming a silicon epitaxial layer on a semiconductor underlayer of a target substrate in a process chamber configured to be selectively supplied with a hydrogen chloride gas, a hydrogen gas, and a silane gas, the method comprising:

a pressure reducing step of reducing a pressure inside the process chamber in which the target substrate has been loaded;

a hydrogen chloride treatment step of performing a supply of the hydrogen chloride gas into the process chamber while stopping a supply of the silane gas into the process chamber, to treat an atmosphere inside the process chamber with the hydrogen chloride gas after the pressure reducing step, wherein the atmosphere inside the process chamber is set to a temperature of 500 to 800° C. and a first reduced pressure in the hydrogen chloride treatment step;

a hydrogen heat treatment step of performing a supply of the hydrogen gas into the process chamber while stopping the supply of the silane gas and the supply of the hydrogen chloride gas into the process chamber, to treat a surface of the semiconductor underlayer with the hydrogen gas after the pressure reducing step, wherein the atmosphere inside the process chamber is set to a temperature higher than 800° C. and a second reduced pressure in the hydrogen heat treatment step; and a vapor phase growth step of performing the supply of the silane gas into the process chamber while stopping the supply of the hydrogen chloride gas into the process chamber, to form the silicon epitaxial layer on the semiconductor underlayer by vapor phase growth after the hydrogen chloride treatment step and the hydrogen heat treatment step, wherein the atmosphere inside the process chamber is set to a film forming temperature and a third reduced pressure in the vapor phase growth step.

2. The silicon epitaxial layer forming method according to claim 1, wherein the silane gas is a monosilane gas and the film forming temperature is 550 to 700° C.

3. The silicon epitaxial layer forming method according to claim 1, wherein the semiconductor underlayer comprises a silicon single crystal.

4. The silicon epitaxial layer forming method according to claim 1, wherein a concentration of hydrogen chloride in the atmosphere inside the process chamber is 0.5 to 20% by volume in the hydrogen chloride treatment step.

5. The silicon epitaxial layer forming method according to claim 1, wherein the first reduced pressure is 0.1 to 10 Torr.

6. The silicon epitaxial layer forming method according to claim 1, wherein a concentration of hydrogen in the atmosphere inside the process chamber is substantially 100% by volume and that of an impurity is less than 0.1% by volume in the hydrogen heat treatment step.

7. The silicon epitaxial layer forming method according to claim 1, wherein the second reduced pressure is 0.1 to 20 Torr.

8. The silicon epitaxial layer forming method according to claim 1, wherein the hydrogen chloride treatment step is carried out before the hydrogen heat treatment step.

9. The silicon epitaxial layer forming method according to claim 8, wherein the hydrogen chloride treatment step is started in a course of a temperature increase of the atmosphere inside the process chamber in which the target substrate has been loaded.

10. The silicon epitaxial layer forming method according to claim 1, wherein the hydrogen heat treatment step is carried out before the hydrogen chloride treatment step.

11. The silicon epitaxial layer forming method according to claim 1, wherein the process chamber has a structure in which a plurality of target substrates are accommodated while being stacked in a vertical direction with an interval between adjacent ones, that the atmosphere inside the process chamber is heated with a heater disposed around the process chamber, and that the target substrates are treated together in the hydrogen chloride treatment step, the hydrogen heat treatment step, and the vapor phase growth step.

12. The silicon epitaxial layer forming method according to claim 4, wherein the hydrogen chloride treatment step comprises performing the supply of the hydrogen gas into the process chamber.

13. The silicon epitaxial layer forming method according to claim 1, wherein the vapor phase growth step comprises performing the supply of the hydrogen gas into the process chamber.

14. The silicon epitaxial layer forming method according to claim 1, wherein the third reduced pressure is 0.1 to 1 Torr.

* * * * *